United States Patent [19]
Nguyen et al.

[11] Patent Number: 5,710,461
[45] Date of Patent: Jan. 20, 1998

[54] SRAM CELL FABRICATION WITH INTERLEVEL DIELECTRIC PLANARIZATION

[75] Inventors: Loi Nguyen, Carrollton; Ravishankar Sundaresan, Garland, both of Tex.

[73] Assignee: SGS-Thomson Microelectronics, Inc., Carrollton, Tex.

[21] Appl. No.: 781,429

[22] Filed: Jan. 10, 1997

Related U.S. Application Data

[60] Continuation of Ser. No. 328,736, Oct. 25, 1995, abandoned, which is a division of Ser. No. 149,338, Dec. 17, 1993, Pat. No. 5,395,785.

[51] Int. Cl.$^6$ .......... H01L 29/34; H01L 23/48; H01L 23/522; H01L 29/54
[52] U.S. Cl. .......... 257/754; 257/760; 257/640; 257/904; 257/752; 257/903; 257/350; 257/380; 257/381; 257/385; 257/758
[58] Field of Search .......... 257/754, 380, 257/381, 382, 379, 752, 755, 756, 757, 758, 903, 908, 905, 904, 350, 384, 385, 760, 640

[56] References Cited

U.S. PATENT DOCUMENTS

| | | | |
|---|---|---|---|
| 4,676,867 | 6/1987 | Elkins et al. | 437/40 |
| 4,797,717 | 1/1989 | Ishibashi et al. | 257/904 |
| 4,920,071 | 4/1990 | Keller et al. | 437/192 |
| 4,975,875 | 12/1990 | Ito | 257/755 |
| 4,990,998 | 2/1991 | Koike et al. | 257/754 |
| 5,001,539 | 3/1991 | Inoue et al. | 257/903 |
| 5,077,238 | 12/1991 | Fujii et al. | 437/235 |
| 5,083,190 | 1/1992 | Pfiester | 257/903 |
| 5,110,763 | 5/1992 | Matsumoto | 437/195 |
| 5,132,774 | 7/1992 | Matsuura et al. | 257/760 |
| 5,151,376 | 9/1992 | Spinner, III | 437/47 |
| 5,159,416 | 10/1992 | Kudoh | 257/903 |
| 5,169,491 | 12/1992 | Doam | 437/235 |
| 5,177,238 | 1/1993 | Lee et al. | 437/47 |
| 5,188,987 | 2/1993 | Ogino | 437/235 |
| 5,204,288 | 4/1993 | Marks et al. | 437/228 |
| 5,219,792 | 6/1993 | Kim et al. | 437/195 |
| 5,290,399 | 3/1994 | Reinhardt | 437/228 |
| 5,319,247 | 6/1994 | Matsuura | 257/760 |
| 5,373,170 | 12/1994 | Pfiester et al. | 257/903 |
| 5,381,046 | 1/1995 | Cederbaum et al. | 257/904 |
| 5,534,731 | 7/1996 | Cheung | 257/760 |
| 5,552,628 | 9/1996 | Watanabe et al. | 257/760 |

FOREIGN PATENT DOCUMENTS

| | | | |
|---|---|---|---|
| 0099243 | 4/1989 | Japan | 257/760 |
| 0135044 | 5/1989 | Japan | 257/760 |
| 2251722 | 7/1992 | Japan | 257/760 |
| 8700828 | 4/1987 | WIPO | 257/760 |

OTHER PUBLICATIONS

IEEE Electron Device Letters, vol. 12, No. 3, Mar. 1991, Hot–Carrier Aging of the MOS Transistor in the Presence of Spin–On Glass as the interlevel Dielectric, by N. Lifshitz and G. Smolinsky, pp. 140–142.

Journal Electrochem. Soc., vol. 139, No. 2, Feb. 1992, Three "Lot Dt" Options for Planarizing the Pre–Metal Dielectric on an Advanced Double Poly BiCMOS Process, by W. Dauksher, M Miller, and C. Tracy, pp. 532–536.

Journal Electrochem. Soc., vol. 139, No. 2, Feb. 1992, Polysilicon Planarization Using Spin–On Glass, by Shrinath Ramaswami and Andrew Nagy, pp. 591–599.

Journal Electronicem. Soc., vol. 140, No. 4, Apr. 1993, The Effect of Plasma Cure Temperature on Spin–On Glass, by Hideo Namatsu and Kazushige Minegishi, pp. 1121–1125.

*Primary Examiner*—Tom Thomas
*Assistant Examiner*—Alexander Oscar Williams
*Attorney, Agent, or Firm*—Theodore E. Galanthay; Lisa K. Jorgenson

[57] ABSTRACT

A 4-T SRAM cell in which two layers of permanent SOG (with an intermediate oxide layer) are used to provide planarization between the first and topmost poly layers.

18 Claims, 5 Drawing Sheets

SRAM CELL FABRICATION WITH INTERLEVEL DIELECTRIC PLANARIZATION

This application is a continuation of application No. 08/328,736, filed Oct. 25, 1995, which was abandoned upon the filing herein which is a divisional of 08/49,338, filed Dec. 17, 1993, now U.S. Pat. No. 5,395,785.

BACKGROUND AND SUMMARY OF THE INVENTION

The present invention relates to integrated circuit fabrication methods and structures, and particularly to integrated circuits with minimum linewidths below one-half micron.

Background: Planarization

As the degree of integration has advanced, it has become increasingly apparently that it is desirable to minimize the topographical excursion of the surface at each level, especially the upper levels. To accomplish this, various planarization schemes have been used to planarize the interlevel dielectric. Some of these include Chemical-Mechanical-Polishing (CMP), use of Permanent Spin-on-glass (left in place in the final chip), and Sacrificial Etchback Spin-on-glass (SOG).

Spin-on glass deposition is an example of a "sol-gel" process, which has been used in the semiconductor industry for many years. The unprocessed spin-on glass material (available in numerous formulations) is a fluid material (actually a gel). After the liquid material is coated onto the face of a wafer, the wafer is rotated at high speed to throw off the excess material. The surface tension and adhesion of the material provides a flat (planarized) surface with a controlled thickness. The liquid material is then baked, to drive off solvents and provide a stable solid silicate glass. See generally, e.g., Dauksher et al., "Three 'low Dt' options for planarizing the pre-metal dielectric on an advanced double poly BiCMOS process," 139 J.ELECTROCHEM-.SOC. 532–536 (1992), which is hereby incorporated by reference.

Background: SRAM Cell Operation

One of the two most common types of SRAM cell is the "4-T" cell, which uses resistive loads. FIG. 7 is a circuit diagram of such a cell (a 4-transistor 2-resistor MOS SRAM cell). In the example shown, the numbering of the bitlines and wordlines indicates that this cell would be in the n-th row and m-th column of an array (or subarray) of memory cells. In this cell, NMOS driver transistors D1 and D2, loaded by resistors R1 and R2, are cross-connected to form a latch. Pass transistors PT1 and PT2 are both accessed by a respective wordline $WL_n$, to connect the two complementary nodes of the latch to a respective complementary pair of bitlines $BL_m$ and $BL_m*$ when wordline $WL_n$ goes high. Thus, in read mode, when wordline $WL_n$ goes high, whichever one of the driver transistors (D1 or D2) is ON will pull down one of the bitlines ($BL_m$ or $BL_m*$), producing a data signal which can be read. In write mode, the bitlines will be clamped by strong drivers, and the pass transistors PT1 and PT2 will pass enough current to change the state of the latch to correspond to the bitline voltages.

In such a memory cell, the resistors R1 and R2 must pass enough current to offset the leakage currents which tend to discharge the high node of the latch. These resistors are conventionally made from nearly intrinsic polysilicon, and therefore tend to have very high resistance values (which may range from many gigaohms up to teraohms). Unfortunately, the resistivity of such polysilicon is fairly variable, and an excessive value for the resistors may cause the cell to lose data under high-temperature conditions. An excessively low value for the polysilicon resistor may lead to excess static power consumption. Thus, precise control of the resistor values would be highly desirable.

Innovative SRAM Structure and Process

This disclosure describes an improved method of four transistor SRAM cell fabrication, wherein planarization is performed before metal formation (and actually before resistor formation). The pre-metal planarization utilizes a sandwich structure comprising permanent SOG, undoped glass, and permanent SOG. The undoped glass is used as a buffer layer between two layers of spin-on-glass to prevent SOG cracks. The double SOG spin enhances the degree of planarization.

The disclosed inventions thus provide the advantages of reduced topography at the poly-2 level, and hence more accurate patterning of the poly resistors, and hence a reduced poly-R resistance value by shortening resistor length (less surface contour due to better planarity). This provides more precise manufacturing control which can be used to set speed and power more reliably.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
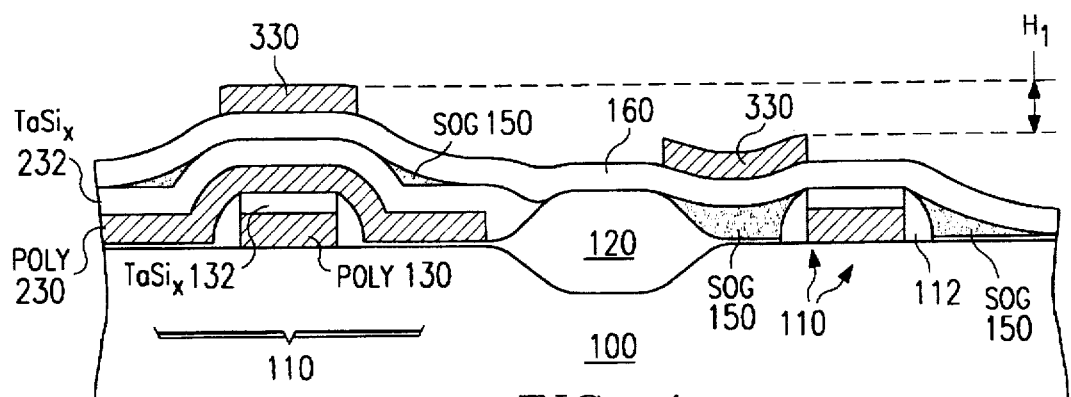
FIG. 1 shows a section of a standard 1 Mb SRAM.

After completion of CMOS transistor formation (and local interconnect formation in the poly-2 layer, if desired), a standard process flow (as shown in FIG. 1) would deposit e.g. 1KÅ of undoped oxide, spin on e.g. 1.5KÅ of SOG, deposit e.g. 1KÅ of undoped oxide, deposit and etch a second polysilicon layer to form polysilicon resistors, and then proceed with contact and metal formation.

In the innovative process embodiments described, fabrication of the lower poly level(s) is instead followed by:

deposition of undoped oxide (not separately shown) to e.g. 1KÅ;

Spin-on and cure of SOG 150 (e.g. P112 from Allied) to e.g. 1.5KÅ;

deposition of additional undoped oxide 152 to e.g. 500Å;

spin-on and cure of additional SOG 155 (e.g. P112 from Allied) to e.g. 1.5KÅ;

deposition of additional undoped oxide 160 to e.g. 1KÅ;

contact etch (if desired); and deposition and patterning of a top level 330 of polysilicon, to form planar resistors.

Processing then continues conventionally with contact and metal formation.

Figure 3:
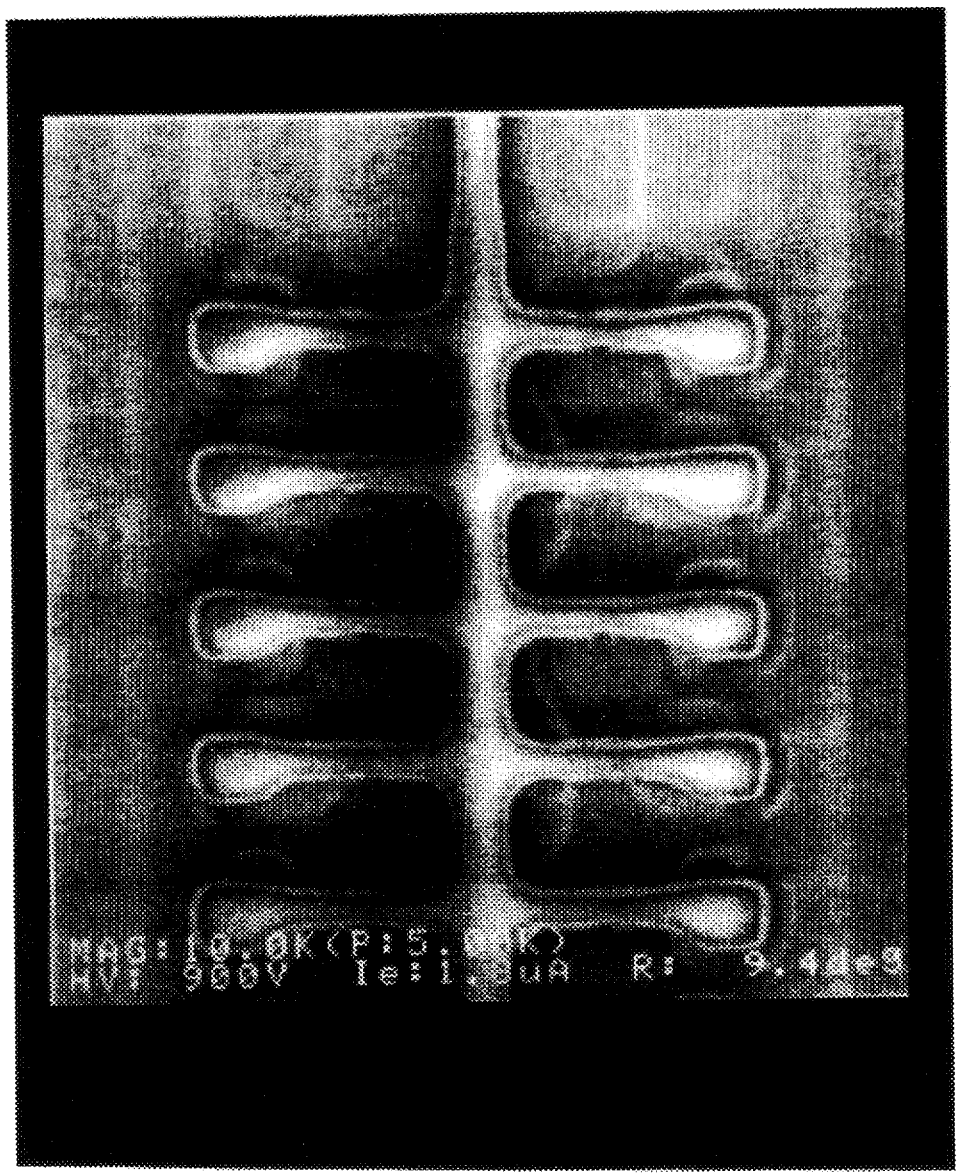
FIG. 3 is a micrograph of a plan view of a standard structure.
Figure 4:
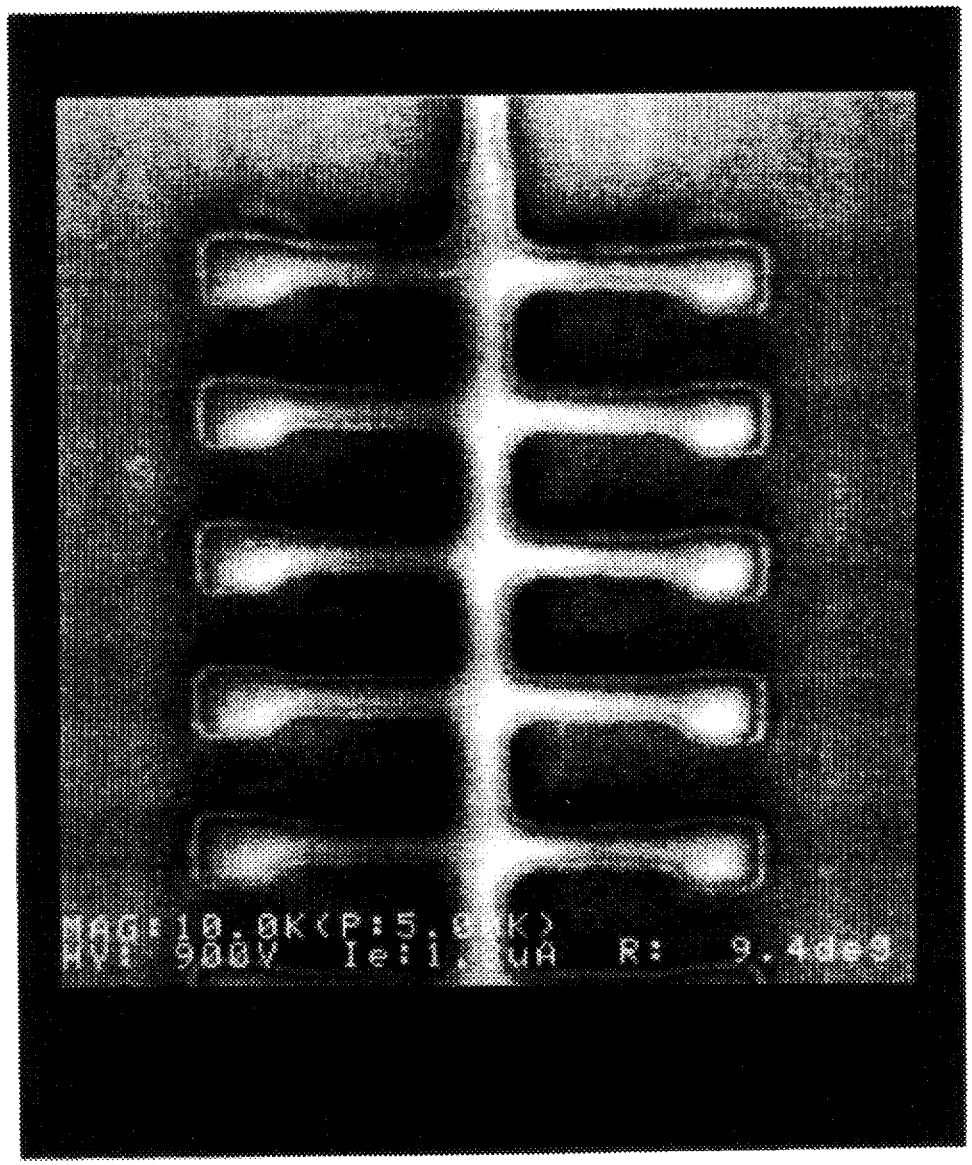
FIG. 4 is a micrograph of a plan view of a comparable structure made according to the disclosed inventions.

The disclosed inventions thus provide the advantages of reduced topography at the top poly level, and hence more accurate patterning of the poly resistors. A comparison of FIGS. 3 and 4 illustrates this advantage: FIG. 3 is a micrograph of a plan view of a standard structure, and FIG. 4 is a micrograph of a plan view of a comparable structure made according to the disclosed inventions.

Figure 5:
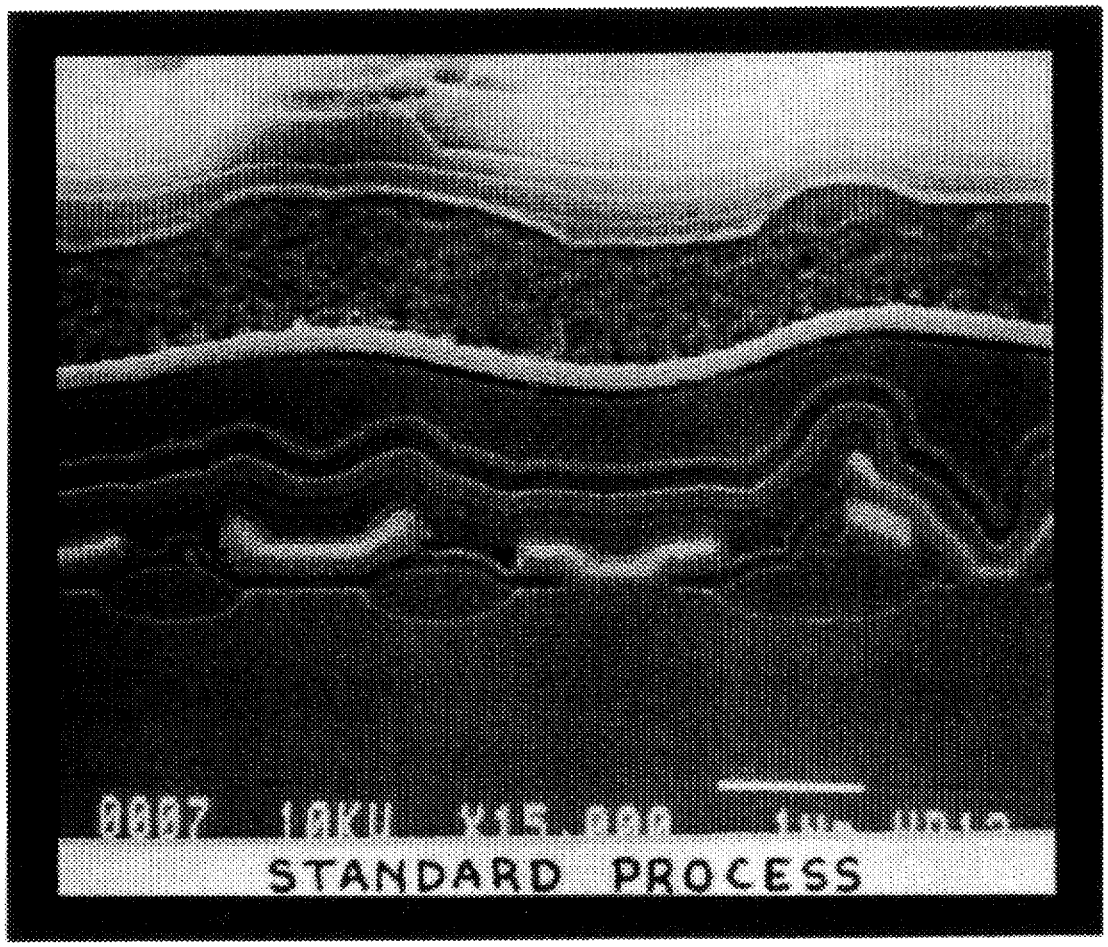
FIG. 5 is a micrograph of a section view of a standard structure.
Figure 6:
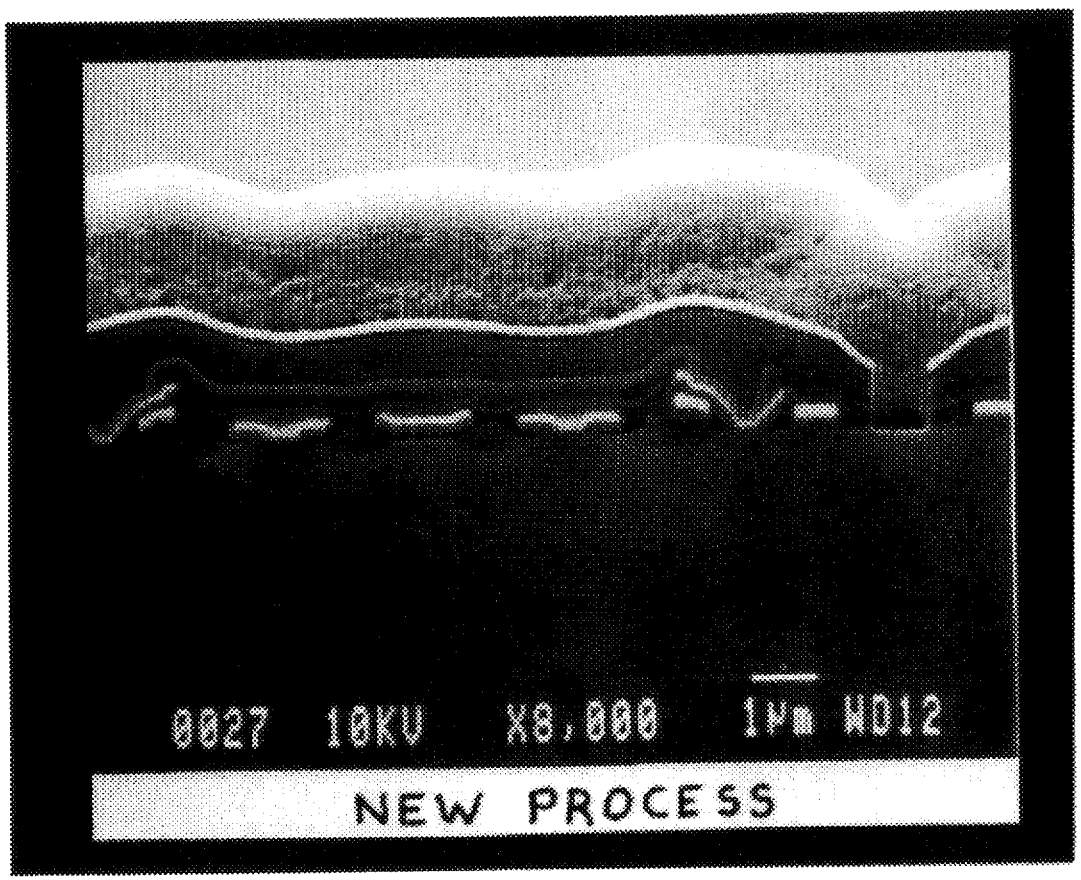
FIG. 6 is a micrograph of a section view of a comparable structure made according to the disclosed inventions.

The disclosed inventions also provide the advantages of reduced poly-R resistance value by shortening the effective resistor length (since the reduced surface contour leads to better planarity). A comparison of FIGS. 5 and 6 illustrates this advantage: FIG. 5 is a micrograph of a section view of a standard structure, and FIG. 6 is a micrograph of a section view of a comparable structure made according to the disclosed inventions. This in turn can be used to provide faster memory operation, since the load resistors can have a greater pullup capability for the same layout area. That is, the reliably greater pullup capability of the load resistors means that the driver and pass transistor dimensions can be selected for faster operation, without risk of upsetting the latch when the pass transistors turn on.

FIG. 1 shows a cross-section through a partially fabricated triple-poly 4-T SRAM cell, which has been partially fabricated according to conventional methods. (Metallization has been omitted for clarity.) Substrate 100 includes multiple IGFET transistors 110 separated by field oxide 120. The gates of these NMOS transistors are provided by a first polysilicon layer 130, which is clad, in the presently preferred embodiment, with a tantalum silicide layer 132. (This composite layer 130/132 is referred to herein as the "poly-1" layer.) The poly-1 layer 130/132 provides gate electrodes for the transistors 110. (The gate oxide which separates the transistor gates from the substrate is too thin, e.g. 100–150 Å, to be shown in this drawing.) Sidewall spacers 112 are self-aligned to the poly-1 layer 130/132.

A second layer of polysilicon 230 (which, in the presently preferred embodiment, is also clad with a respective tantalum silicide layer 232) provides local interconnect within the cell. (This composite layer 230/232 is referred to herein as the "poly-2" layer.) A permanent SOG layer 150, overlaid by an undoped oxide layer 160, provides some planarization over the poly-2 layer. (An additional layer of undoped oxide, which is omitted from this drawing for simplicity, underlies the permanent SOG layer 150.) A shared contact, in the presently preferred embodiment, provides contacts from poly-1 and poly-2 to active.

A third polysilicon layer 330, made of substantially intrinsic polysilicon, provides the polysilicon resistors. (This layer 330 is referred to herein as the "poly-R" layer.) Another shared contact is used to provide contact from this layer to the poly-2 (and poly-1) layers.

Figure 2:
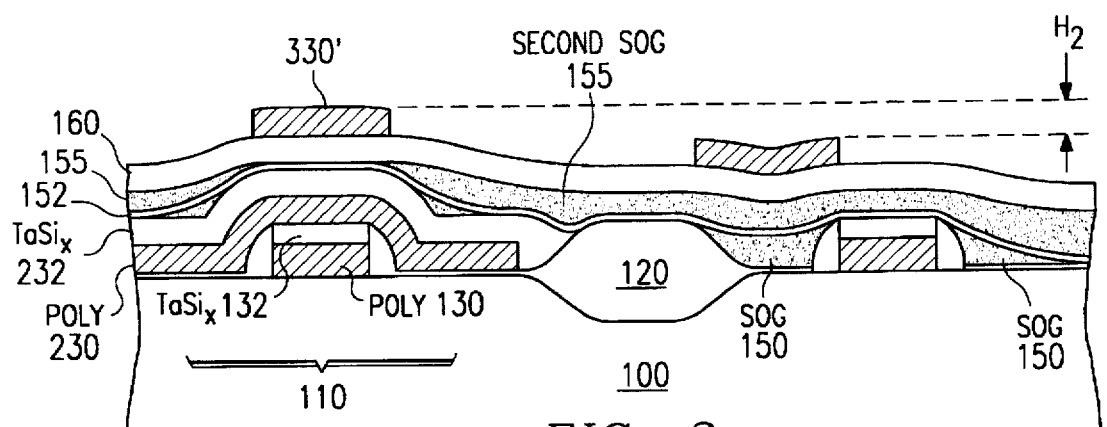
FIG. 2 shows a modification of the structure according to the disclosed innovations.
Figure 7:
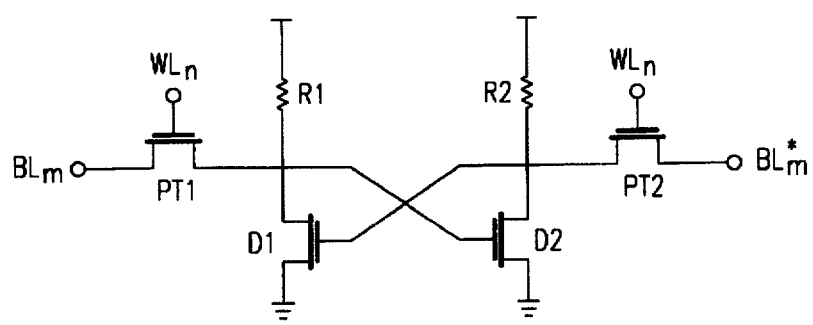
FIG. 7 is a circuit diagram of a 4-transistor 2-resistor MOS SRAM cell.

FIG. 2 shows a cross-section through a partially fabricated triple-poly 4-T SRAM cell, which has been partially fabricated according to the disclosed innovative methods.

Elements 100, 110, 120, 130, 132, 112, 230, 232, and 150 all are generally the same as the corresponding elements in FIG. 1. However, in the structure of FIG. 2, an additional layer of undoped oxide 152 overlies the SOG 150, and an additional planarizing layer 155 of permanent SOG (e.g. P114 from Allied) overlies the oxide layer 152.

This results in a structure wherein the topographic excursion $H_2$ of the more planar poly-R layer 330'0 provided by the disclosed innovations is much less than the topographic excursion $H_1$ of the poly-R layer 330 of the more conventional structure shown in FIG. 1.

The disclosed inventions also provide the advantages of reduced topographical excursion for the contact and metal-1 layer, and hence reduced requirements for planarization after the poly-2 layer.

The resistors R1 and R2 are preferably laid out to have a target resistance value of about 1TΩ, but of course this value can be adjusted, by appropriate layout changes, to adjust for speed and power requirements as needed. However, the disclosed innovations permit the resistor value to be specified with greater precision.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

While the inventions have been described with primary reference to a 4-T SRAM cell, it will be readily recognized that these inventions can also be applied to other integrated circuits which use resistive loads. Note, however, that the disclosed innovations would not be as applicable to processes which include floating-gate memory cells or poly-to-poly capacitors in the top poly level, since the planarization provided by the disclosed inventions would require additional process complexity to achieve the close coupling from the top poly level to the next lower poly level.

Although the presently preferred embodiment actually uses a triple-poly cell layout, it will be readily recognized that the disclosed ideas can also be adapted for use in a double-poly resistive-load SRAM cell.

Although the resistors are formed from intrinsic polysilicon in the presently preferred embodiment, it will be recognized that a slight amount of doping may be desirable to stabilize the characteristics of this material. For example, this material may be doped with chlorine, or may be SIPOS (containing a large fraction of oxygen).

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit SRAM cell, comprising:

a substrate which includes at least one substantially monolithic body of semiconductor a first patterned thin-film layer comprising polysilicon;

a second patterned thin-film layer comprising polysilicon and overlying said first thin-film layer, said second layer being doped to provide high conductivity;

a patterned interlevel dielectric overlying portions of said first and second thin-film layers, said interlevel dielectric including multiple independently planarized layers of dielectric material therein, said multiple independently planarized layers including a lower portion of a spin-on glass a middle portion of a dielectric material which is not spin-on glass, and an upper portion of spin-on glass;

a third patterned thin-film layer comprising substantially undoped polysilicon having a very high resistivity;

wherein said first patterned thin-film layer is configured to provide transistor gates, and said first and second thin-film layers are interconnected to provide an array of latches, and said third thin-film layer overlies said patterned interlevel dielectric and is interconnected through contact holes with said first and second layers to provide resistive loads for each said latch.

2. The integrated circuit of claim 1, wherein said first thin-film layer also comprises a silicide cladding.

3. The SRAM cell of claim 1, wherein said interlevel dielectric comprises two layers of spin-on glass.

4. The SRAM cell of claim 1, wherein said interlevel dielectric also comprises at least two dielectric layers which are not planarized.

5. The SRAM cell of claim 1, wherein said second interlevel dielectric comprises at least four layers.

6. The SRAM cell of claim 1, wherein said loads each have a resistance value of about 1TΩ.

7. An integrated circuit SRAM cell, comprising:

first and second overlaid thin-film conductor layers, each comprising clad polysilicon; at least one of said conductor layers being capacitively coupled to substantially monolithic semiconductor material to define field-effect transistor channels therein;

a patterned interlevel dielectric overlying portions of said second thin-film layer, and including multiple independently planarized layers of dielectric material therein, said multiple independently planarized layers of dielectric material including at least three different layers of dielectric material, with at least two of said layers of dielectric material being independently planarized layers of pin-on glass;

a third patterned thin-film layer comprising substantially undoped polysilicon having a very high resistivity, and lying on a substantially planar top surface of said patterned interlevel dielectric;

wherein said first patterned thin-film layer is configured to provide transistor gates, and lust and second thin-film layers are interconnected to provide an array of latches, and said third thin-film layer overlies said patterned interlevel dielectric and is interconnected through contact holes with said first and second layers to provide passive loads for respective ones of said latches.

8. The SRAM cell of claim 7, wherein said interlevel dielectric comprises two layers of spin-on glass.

9. The SRAM cell of claim 7, wherein said interlevel dielectric also comprises at least two dielectric layers which are not planarized.

10. The SRAM cell of claim 7, wherein said interlevel dielectric comprises at least four layers.

11. The SRAM cell of claim 7, wherein said loads each have a resistance value of about 1TΩ.

12. An integrated circuit SRAM cell, comprising:

at least one patterned thin-film conductor layer comprising polysilicon and being capacitively coupled to substantially monolithic semiconductor material to define field-effect transistor channels therein;

a patterned interlevel dielectric overlying said thin-film conductor layers, and including multiple independently planarized layers of dielectric material therein, said multiple independently planarized layers of dielectric material including at least three different layers of dielectric material, with at least two of said layers of dielectric material being independently planarized layers of spin-on glass;

an additional patterned thin-film layer comprising substantially intrinsic polysilicon, and lying on a substantially planar top surface of said patterned interlevel dielectric;

wherein said patterned thin-film conductor layer are interconnected to provide an array of latches, and said additional thin-film layer overlies said patterned interlevel dielectric and is interconnected through contact holes with said conductor layers to provide passive loads for respective ones of said latches.

13. The SRAM cell of claim 12, wherein said additional layer comprises SIPOS.

14. The SRAM cell of claim 12, wherein said additional layer comprises polysilicon doped with chlorine.

15. The SRAM cell of claim 12, wherein said interlevel dielectric comprises two layers of spin-on glass.

16. The SRAM cell of claim 12, wherein said interlevel dielectric also comprises at least two dielectric layers which are not planarized.

17. The SRAM cell of claim 12, wherein said interlevel dielectric comprises at least four layers.

18. The SRAM cell of claim 12, wherein said loads each have a resistance value of about 1TΩ.

* * * * *